US008933752B2

(12) United States Patent
Nagatani et al.

(10) Patent No.: US 8,933,752 B2
(45) Date of Patent: Jan. 13, 2015

(54) POWER AMPLIFIER APPARATUS, DISTORTION COMPENSATION COEFFICIENT UPDATING METHOD, AND TRANSMISSION APPARATUS (75) Inventors: Kazuo Nagatani, Kawasaki (JP); Yuichi Utsunomiya, Kawasaki (JP); Nobukazu Fudaba, Kawasaki (JP); Hiroyoshi Ishikawa, Kawasaki (JP); Hajime Hamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 136 days.

(21) Appl. No.: 13/277,409

(22) Filed: Oct. 20, 2011

(65) Prior Publication Data

US 2012/0098596 A1    Apr. 26, 2012

(30) Foreign Application Priority Data

Oct. 21, 2010    (JP) .................................. 2010-236432

(51) Int. Cl.
*H03F 1/26*    (2006.01)

(52) U.S. Cl.
USPC .......................... 330/149; 455/114.3; 375/297

(58) Field of Classification Search
USPC .......................... 330/149; 455/114.3; 375/297
IPC .................. H03F 1/26; H04B 1/04; H04K 1/02
See application file for complete search history.

(56) References Cited

U.S. PATENT DOCUMENTS

| 6,141,390 | A | 10/2000 | Cova |
| 6,504,425 | B1 | 1/2003 | Kim |
| 6,717,464 | B2* | 4/2004 | Fudaba et al. ................ 330/149 |
| 6,903,604 | B2 | 6/2005 | Kim |
| 7,003,051 | B2* | 2/2006 | Francos et al. ................ 375/296 |
| 7,333,559 | B2* | 2/2008 | Song et al. .................... 375/296 |
| 7,430,248 | B2* | 9/2008 | McCallister .................. 375/296 |
| 7,433,421 | B2* | 10/2008 | Shako et al. .................. 375/296 |
| 7,627,293 | B2 | 12/2009 | Bhandari et al. |
| 8,055,217 | B2* | 11/2011 | Ba et al. ..................... 455/114.3 |
| 8,150,336 | B2* | 4/2012 | Waheed et al. ............ 455/114.3 |
| 2010/0164620 | A1 | 7/2010 | Hamada et al. |

FOREIGN PATENT DOCUMENTS

| JP | 2005-20515 A | 1/2005 |
| JP | 2010-074723 | 4/2010 |
| JP | 2010-124190 | 6/2010 |
| JP | 2010-157898 | 7/2010 |

OTHER PUBLICATIONS

JPOA—Office Action of Japanese Patent Application No. 2010-236432 dated Jul. 22, 2014 with Partial Translation.

* cited by examiner

*Primary Examiner* — Patricia Nguyen
(74) *Attorney, Agent, or Firm* — Fujitsu Patent Center (57) ABSTRACT A power amplifier apparatus that includes a processor that performs a first distortion compensation processing on an input signal using a distortion compensation coefficient to obtain a first signal and an amplifier that amplifies the first signal. The processor performs a second distortion compensation processing the amplified signal using the distortion compensation coefficient to obtain a second signal and updates the distortion compensation coefficient to enable convergence between the first signal and the second signal.

12 Claims, 7 Drawing Sheets

POWER AMPLIFIER APPARATUS, DISTORTION COMPENSATION COEFFICIENT UPDATING METHOD, AND TRANSMISSION APPARATUS

CROSS-REFERENCE TO RELATED APPLICATIONS

This application is based upon and claims the benefit of priority of the prior Japanese Patent Application No. 2010-236432, filed on Oct. 21, 2010, the entire contents of which are incorporated herein by reference.

FIELD

The embodiments discussed herein relate to power amplifier apparatuses, distortion compensation coefficient updating methods, and transmission systems.

BACKGROUND

High power efficiency is required in power amplifier apparatuses for wireless communication. It is necessary to make the power amplifier work at a nonlinear region to increase the power efficiency of the power amplifier. On the other hand, when a power amplifier is used in a linear region, the power efficiency decreases. Thus, linearity and power efficiency are considered as conflicting characteristics. Hence, various distortion compensation methods have been proposed for a power amplifier apparatus to realize both linearity and power efficiency in a power amplifier.

A predistorter is known as one of the distortion compensation methods. This method is adding the inverse characteristic of the distortion of the power amplifier to the amplifier input signal, and canceling the distortion at the power amplifier output.

Figure 1:
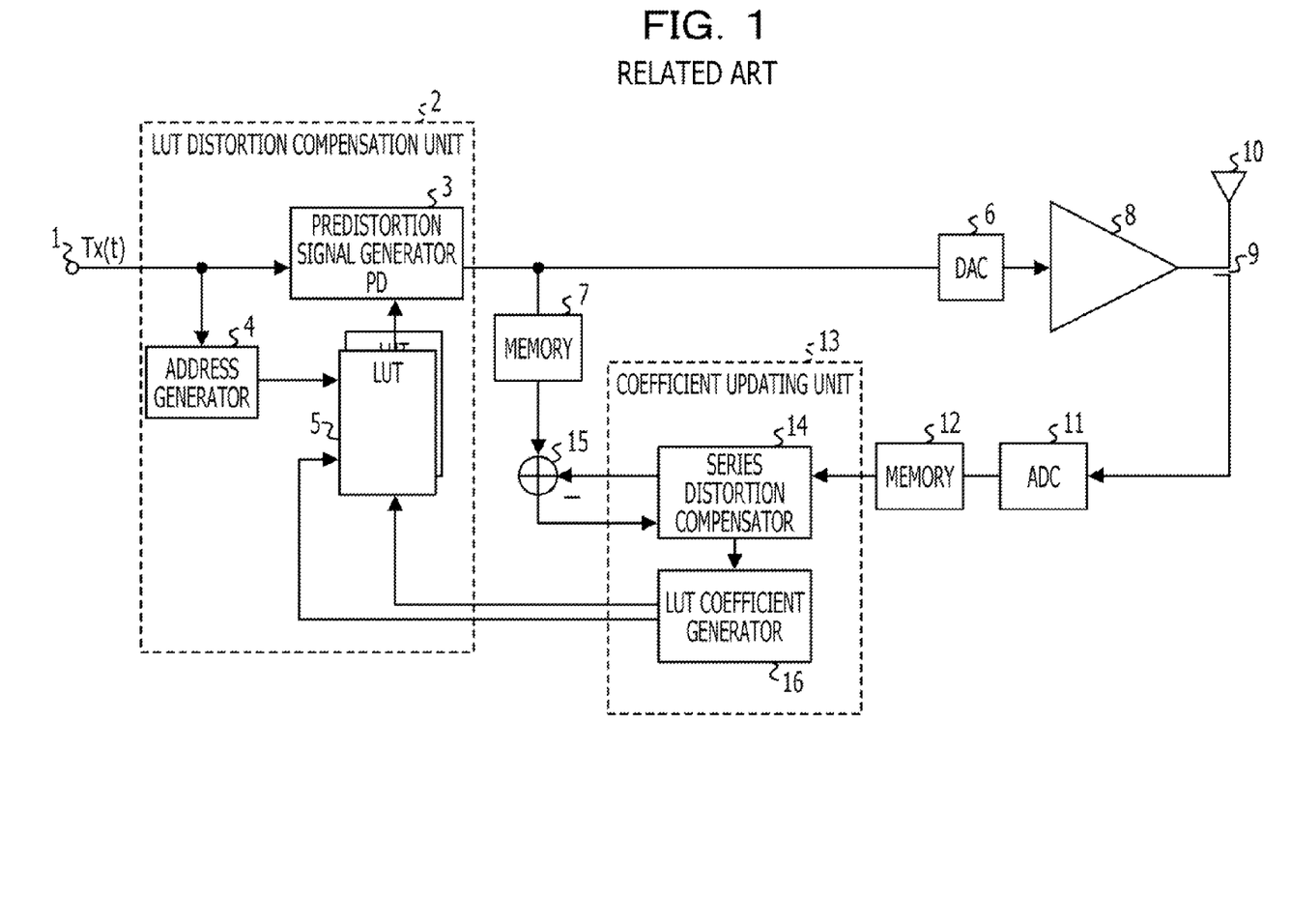
FIG. 1 is an exemplary configuration diagram of an existing power amplifier apparatus.

FIG. 1 is an exemplary configuration diagram of an existing power amplifier apparatus.

A complex-data transmission signal Tx(t) is supplied to a terminal 1. This transmission signal is supplied to a predistortion signal generator 3 and an address generator 4 within a look up table (LUT) distortion compensation unit 2. The address generator 4 generates the address of an LUT 5 from, for example, the amplitude of the transmission signal Tx(t). The address generator 4 supplies the generated address to the LUT 5. Thereby, the LUT 5 reads distortion compensation coefficients for a series distortion compensation method in accordance with the address. The LUT 5 supplies the distortion compensation coefficients to the predistortion signal generator 3.

The predistortion signal generator 3 multiplies an input signal by the distortion compensation coefficients to generate a predistortion signal. Note that complex multiplication is performed for complex data. The predistortion signal generator 3 supplies the predistortion signal to a DAC 6 and writes the predistortion signal into a memory 7. The DAC 6 supplies the predistortion signal having been converted into an analog signal to a power amplifier 8. The power amplifier 8 amplifies the power of the supplied signal. The amplified signal is transmitted through a directional coupler 9 and an antenna 10.

Part of the output signal of the power amplifier 8 is extracted from the directional coupler 9 and digitized by an ADC 11. The digitized signal is written into a memory 12 as a feedback signal. The feedback signal read from the memory 12 is supplied to a series distortion compensator 14 within a coefficient updating unit 13. The series distortion compensator 14 performs series operations on the feedback signal and generates a predistortion signal. The series distortion compensator 14 supplies the generated predistortion signal to a subtracter 15.

The memory 7 supplies the subtracter 15 with the predistortion signal read in synchronization with the above-described feedback signal. The subtracter 15 subtracts the predistortion signal of the feedback signal from the predistortion signal supplied from the memory 7 to obtain an error. The subtracter 15 supplies the obtained error to the series distortion compensator 14. The series distortion compensator 14 performs adaptive control so as to reduce and/or minimize the error. For example, the series distortion compensator 14 computes the coefficients of a Volterra series. An LUT coefficient generator 16 generates LUT distortion compensation coefficients from the coefficients of the Volterra series output from the series distortion compensator 14. The LUT coefficient generator 16 supplies the LUT 5 with the address of the LUT 5 and the LUT distortion compensation coefficients. Thereby, the LUT distortion compensation coefficients of the LUT 5 are updated.

U.S. Pat. No. 6,903,604, U.S. Pat. No. 6,504,425, U.S. Pat. No. 6,141,390, and U.S. Pat. No. 7,627,293 propose techniques to collect and analyze a predistortion signal and a feedback signal, thereby controlling the parameters of a predistortion signal generation polynomial.

SUMMARY

According to an aspect of the embodiment, a power amplifier apparatus that amplifies a signal, the apparatus includes: a processor that performs a first distortion compensation processing on a signal using a distortion compensation coefficient and an amplifier that amplifies the signal performed the first distortion compensation processing, wherein the processor performs a second distortion compensation processing the amplified signal using the distortion compensation coefficient and updates the distortion compensation coefficient to a value that enables convergence of a difference between the signal performed the first distortion compensation processing and the signal performed the second distortion compensation processing.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

As in the existing techniques, a Volterra series is often used to model a nonlinear system. Referring to FIG. 1, when a Volterra series is applied to distortion compensation, the coefficients of the Volterra series may be directly computed using a feedback signal, which is the output of the power amplifier 8, and an error signal. To decrease circuit size, the power amplifier apparatus has a configuration in which the LUT coefficient generator 16 computes the LUT distortion compensation coefficients from the coefficients of the Volterra series using the LUT 5.

In the above-described configuration, the order of the Volterra series increases in accordance with the input and output characteristics of the power amplifier 8. When the order of the Volterra series increases, the computation of the coefficients of the Volterra series in the series distortion compensator 14 becomes complex. Further, the LUT coefficient generator 16 generates the LUT distortion compensation coefficients. Hence, the above-described configuration has a problem in that the circuit sizes of the series distortion compensator 14 and the LUT coefficient generator 16 are increased.

Preferred embodiments of the present invention will be explained with reference to accompanying drawings and have been developed, in part, to address the above-described.

[a] First Embodiment

Figure 2:
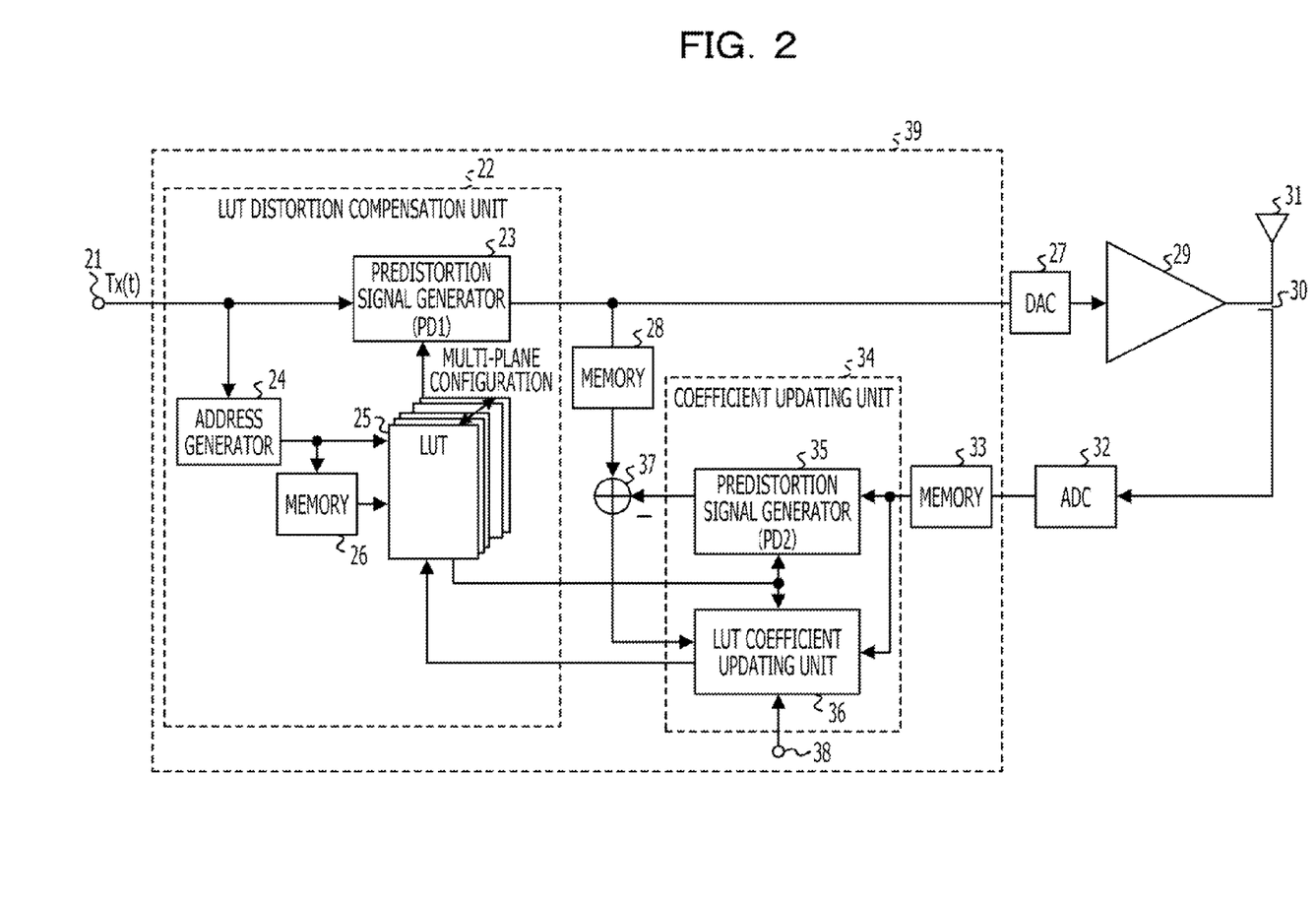
FIG. 2 is a configuration diagram of a power amplifier apparatus according to a first embodiment.

FIG. 2 is a configuration diagram of a power amplifier apparatus according to a first embodiment.

Referring to FIG. 2, a power amplifier apparatus according to the first embodiment includes a terminal 21, a terminal 38, a digital signal processor (DSP) 39, a digital to analog converter (DAC) 27, an analog to digital converter (ADC) 32, a power amplifier 29, a directional coupler 30, and an antenna 31.

The DSP 39 is a processor performing digital signal processing and includes an LUT distortion compensation unit 22, a coefficient updating unit 34, a memory 28, a memory 33, and a subtracter 37. The DSP 39 is an example. Embodiments are not limited to such a configuration, a field-programmable gate array (FPGA), an application specific integrated circuit (ASIC), or the like may be used. Herein, the DSP 39, an FPGA, an ASIC or the like may be referred to generically as a controller, for example. However, in the example described below, the processing that the LUT distortion compensation unit 22, the coefficient updating unit 34, and the subtracter 37 performs is executed by DSP.

A transmission signal Tx(t) having complex data formed of an I(In-phase component) value and a Q(Quadrature-phase component) value is supplied to the terminal 21. The transmission signal is supplied to a predistortion signal generator 23 and an address generator 24. The address generator 24 generates the address of an LUT 25 from, for example, the amplitude of the transmission signal Tx(t) and supplies the generated address to the LUT 25 and a memory 26. Note that the address generated by the address generator 24 includes a total of j values including a value obtained by evaluating a function by substituting the absolute value (magnitude: |Tx(t)|) of the transmission signal Tx(t) for the variable and values obtained by sequentially delaying this value by a unit period. All the j values are written into the memory 26 as an address.

The LUT 25 reads LUT distortion compensation coefficients corresponding to the supplied address. For example, the LUT distortion compensation coefficients may correspond to a series distortion compensation method using a Volterra series. The LUT 25 supplies the read LUT distortion compensation coefficients to the predistortion signal generator 23. The LUT distortion compensation coefficients read from the LUT 25 are supplied to the coefficient updating unit 34 described later for the address read from the memory 26. According to an embodiment the read LUT distortion compensation coefficients are supplied to both the predistortion signal generator 23 and the coefficient updating unit 34.

The predistortion signal generator 23 multiplies the transmission signal Tx(t) by the LUT distortion compensation coefficients to generate a first predistortion signal PD1($t$). The predistortion signal PD1($t$) is supplied to the DAC 27 and written into the memory 28. The first predistortion signal PD1($t$) converted to an analog signal by the DAC 27 is amplified by the power amplifier 29, supplied to the antenna 31 through the directional coupler 30, and transmitted.

Part of the output signal of the power amplifier 29 extracted from the directional coupler 30 is digitized by the ADC 32 and written into the memory 33 as a feedback signal Fb(t). The feedback signal Fb(t) read from the memory 33 is supplied to a predistortion signal generator 35 and an LUT coefficient updating unit 36.

The predistortion signal generator 35 may have the same configuration as the predistortion signal generator 23. As noted above, the LUT distortion compensation coefficients read from the LUT 25 are supplied to the predistortion signal generator 35 for the address from the memory 26. The predistortion signal generator 35 generates a second predistortion signal PD2($t$) by multiplying the feedback signal with the LUT distortion compensation coefficients. The predistortion signal generator 35 supplies the generated predistortion signal PD2($t$) to the subtracter 37. The subtracter 37 is supplied with the first predistortion signal PD1($t$) read from the memory 28 in synchronization with the feedback signal. The subtracter 37 obtains an error e(t) expressed by Equation (1) by subtracting the second predistortion signal PD2($t$) from the first predistortion signal PD1($t$) and supplies the error e(t) to the LUT coefficient updating unit 36.

$$e(t)=PD1(t)-PD2(t) \qquad (1)$$

The LUT coefficient updating unit 36 is supplied with, in addition to the error e(t), the feedback signal Fb(t) read from the memory 33, an LUT distortion compensation coefficient $LUT_{i,j}(|Tx(t-i)|)$ read from the LUT 25, and an attenuation coefficient μ, which is referred to herein as a step size parameter, read from the terminal 38. The LUT coefficient updating unit 36 generates a new LUT distortion compensation coefficient $LUT_{i,j}(|Tx(t-i)|)$ using Equation (2). The LUT coefficient updating unit 36 updates the LUT 25 by supplying the newly generated LUT distortion compensation coefficient to the LUT 25. Note that "*" denotes a complex conjugate.

$$LUT_{i,j}(|Tx(t-j)|)=LUT_{i,j}(|Tx(t-j)|)+\mu \times e(t) \times Fb^*(t-i) \qquad (2)$$

The error e(t) is a vector. In Equation (2), the error e(t) is multiplied by the complex conjugate Fb*(t−i) to make the error vector be directed in a specified direction. By repeating the operation of Equation (2), the error e(t) converges to a value close to zero.

Figure 3:
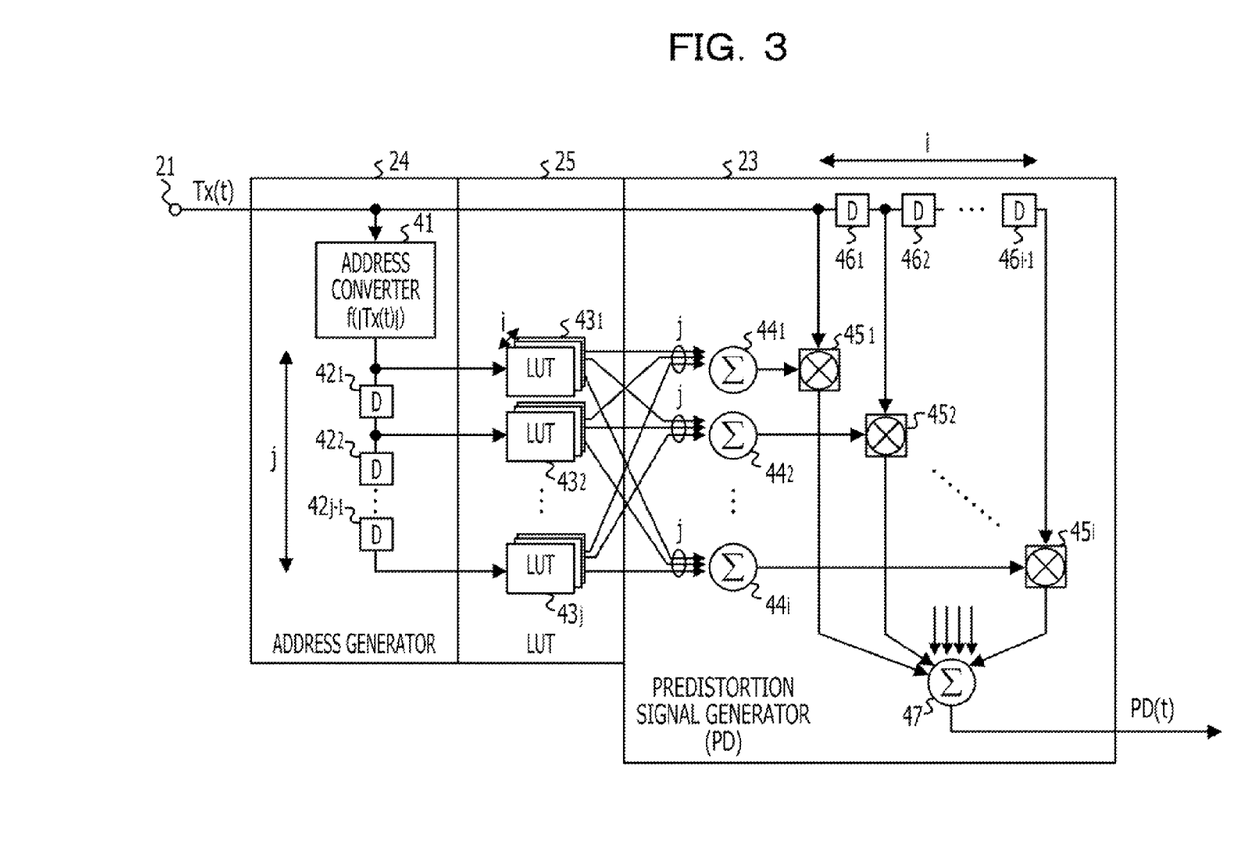
FIG. 3 is a detailed configuration diagram of portions of an LUT distortion compensation unit according to the first embodiment.

FIG. 3 is a detailed configuration diagram of portions of the LUT distortion compensation unit 22 according to the first embodiment.

Referring to FIG. 3, the address generator 24 includes an address converter 41 and (j−1) serially connected unit delay elements 42. The address converter 41 converts the absolute value |Tx(t)| of the transmission signal Tx(t) into a value obtained by evaluating the function f by substituting the absolute value |Tx(t)| of the transmission signal Tx(t) for the variable. The address converter 41 supplies the value obtained after conversion to the LUT 25 as an address. This address is sequentially delayed by a unit period by each of the unit delay elements $42_1$ to $42_{j-1}$ and includes a total of j values including the output value of the address converter 41 and the (j−1) output values of the unit delay elements $42_1$ to $42_{j-1}$.

The LUT 25 includes j table groups $43_1$ to $43_j$ and each of the table groups includes i tables. The j table groups $43_1$ to $43_j$ are respectively supplied with, as addresses, j values including the output value of the address converter 41 and the (j−1) output values of the unit delay elements $42_1$ to $42_{j-1}$. Thereby, each of the j table groups $43_1$ to $43_j$ reads i LUT distortion compensation coefficients. The i LUT distortion compensation coefficients are respectively supplied to i adders $44_1$ to $44_i$.

An adder $44_1$ of the predistortion signal generator 23 supplies the sum of j LUT distortion compensation coefficients supplied from the first tables of the table groups $43_1$ to $43_j$ to a multiplier $45_1$. Similarly, adders $44_2$ to $44_i$ respectively supply the multipliers $45_2$ to $45_i$ with the sums of j LUT distortion compensation coefficients supplied from the second tables of the table groups $43_1$ to $43_j$ to ith tables of the table groups $43_1$ to $43_j$.

The predistortion signal generator 23 is provided with (i−1) serially connected unit delay elements $46_1$ to $46_{i-1}$. The transmission signal Tx(t) from the terminal 21 is supplied to the multiplier $45_1$. In other words, the transmission signals sequentially delayed by a unit period by the unit delay elements $46_1$ to $46_{i-1}$ are respectively supplied to the multipliers $45_2$ to $45_i$. Each of the multipliers $45_1$ to $45_i$ multiplies the sequentially delayed transmission signal by the sum of the LUT distortion compensation coefficients from the adders $44_1$ to $44_i$ and supplies the result to an adder 47. The adder 47 adds the outputs of the multipliers $45_1$ to $45_i$ and outputs the sum as a predistortion signal PD(t) expressed by Equation (3).

$$PD(t) = \sum_{i=0}^{Delay} \sum_{j=0}^{Delay} LUT_{i,j}(T|x(t-j)|)Tx(t-i) \quad (3)$$

Figure 4:
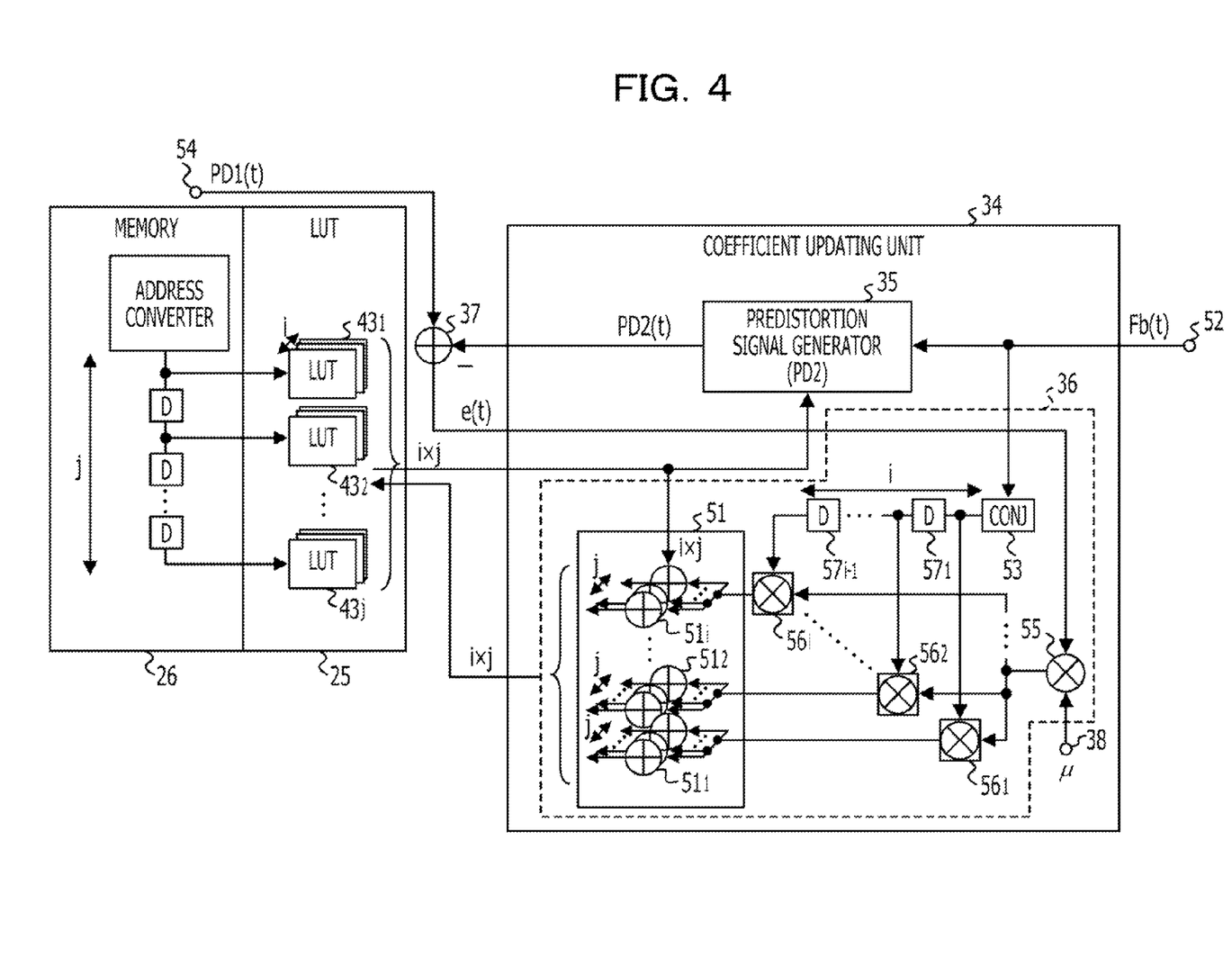
FIG. 4 is a detailed configuration diagram of a coefficient updating unit according to the first embodiment.

FIG. 4 is a detailed configuration diagram of the coefficient updating unit 34 according to the first embodiment. FIG. 4 illustrates the LUT 25 and the memory 26 in addition to the coefficient updating unit 34. Since the memory 26 stores the addresses generated by the address generator 24, the address converter and unit delay elements of the address generator 24 are illustrated as a copy in the memory 26.

The memory 26 supplies all the j values as an address to the LUT 25. Thereby, each of the j table groups $43_1$ to $43_j$ reads i LUT distortion compensation coefficients. The i LUT distortion compensation coefficients are supplied to the predistortion signal generator 35 and an addition unit 51 within the LUT coefficient updating unit 36. A terminal 52 supplies the feedback signal Fb(t) read from the memory 33 to the predistortion signal generator 35 and a complex conjugate unit (conj) 53 within the LUT coefficient updating unit 36.

The predistortion signal generator 35 generates the second predistortion signal PD2(t) by multiplying the feedback signal Fb(t) by the LUT distortion compensation coefficients. The predistortion signal generator 35 supplies the generated second predistortion signal PD2(t) to the subtracter 37. The first predistortion signal PD1(t) synchronized with the second predistortion signal PD2(t) is supplied to the subtracter 37 from the memory 28 through a terminal 54. The subtracter 37 obtains the error e(t) by subtracting the second predistortion signal PD2(t) from the first predistortion signal PD1(t). The subtracter 37 supplies the error e(t) to a multiplier 55 within the LUT coefficient updating unit 36. The attenuation coefficient μ is supplied to the multiplier 55 through the terminal 38. The multiplier 55 multiplies the error e(t) by the attenuation coefficient μ and supplies the result to multipliers $56_1$ to $56_i$.

On the other hand, the complex conjugate unit 53 obtains the complex conjugate Fb*(t) of the feedback signal Fb(t). This complex conjugate Fb*(t) of the feedback signal Fb(t) is sequentially delayed by a unit period by (i−1) serially connected unit delay elements $57_1$ to $57_{i-1}$ and supplied to the multipliers $56_1$ to $56_i$. The multipliers $56_1$ to $56_i$ multiply the complex conjugate of the feedback signal by the product of the error e(t) and the attenuation coefficient μ. The multipliers $56_1$ to $56_i$ generate values corresponding to the second term [μ×e(t)×Fb*(t−i)] on the right side of Equation (2), with the multiplied results serving as the updated values of the LUT distortion compensation coefficients. The multipliers $56_1$ to $56_i$ supply the generated values corresponding to the second term [μ×e(t)×Fb*(t−i)] on the right side of Equation (2) to the addition unit 51.

The addition unit 51 includes adder groups $51_1$ to $51_i$ each group having j adders. The adder groups $51_1$ to $51_i$ respectively receive the outputs of the multipliers $56_1$ to $56_i$ and also values corresponding the first term [$LUT_{i,j}$(|Tx(t−j)|)] on the right side of Equation (2) from the LUT 25. The i×j adders of the addition unit 51 respectively calculate i×j LUT distortion compensation coefficients, which correspond to the left side of Equation (2). The i×j LUT distortion compensation coefficients thus calculated are supplied to the LUT 25, whereby the LUT 25 is updated.

In the first embodiment, by using an error and a feedback signal, the update values for LUT distortion compensation coefficients are directly computed so as to cause the error converge, without computing the coefficients of a Volterra series, for example. Hence, the computation of the LUT distortion compensation coefficients is simplified and the circuit size of the coefficient updating unit 34 is reduced compared with techniques described in the back ground.

[b] Second Embodiment

Figure 5:
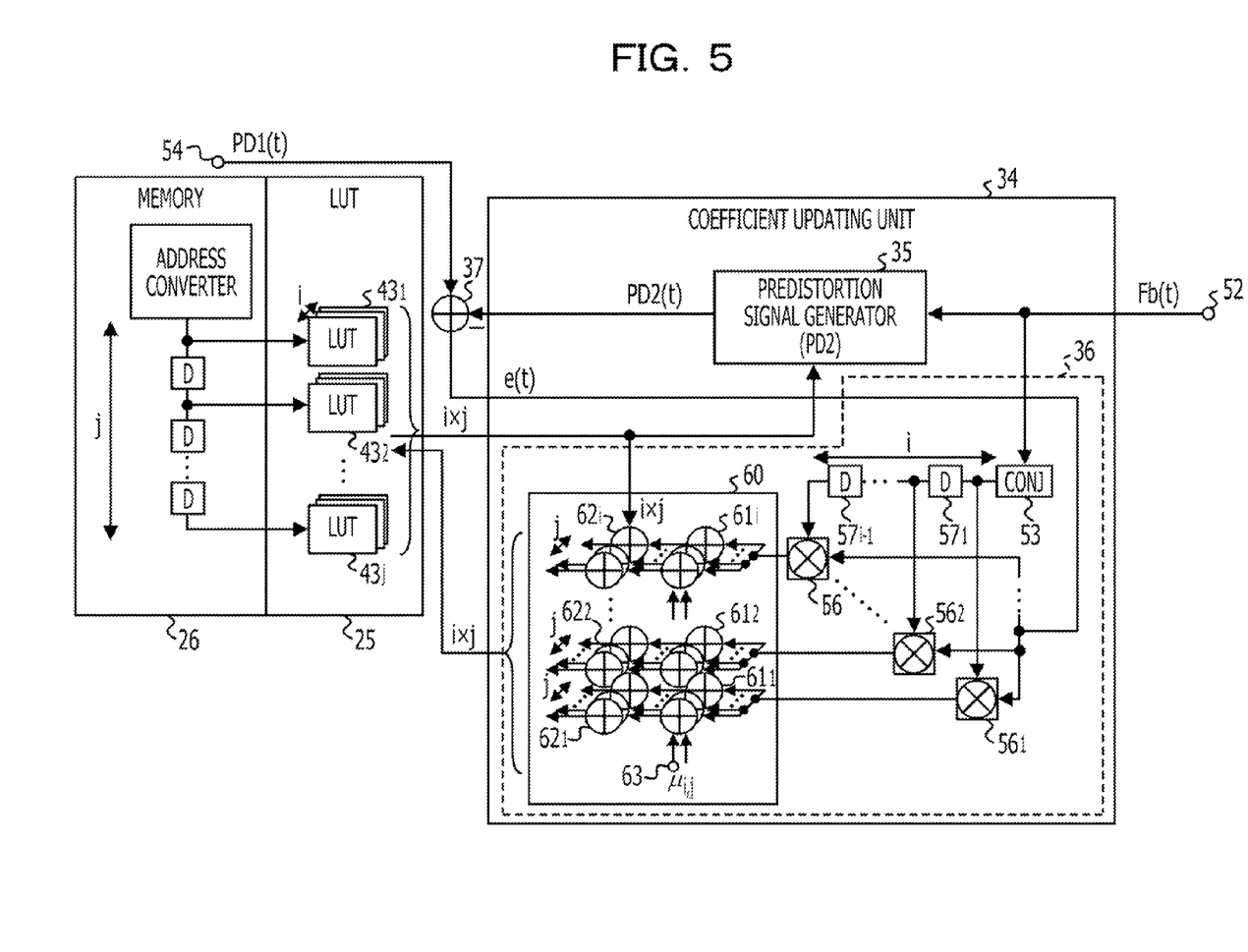
FIG. 5 is a detailed configuration diagram of a coefficient updating unit according to a second embodiment.

FIG. 5 is a detailed configuration diagram of a coefficient updating unit 34 according to a second embodiment.

In FIG. 5, portions which are the same as those in FIG. 4 are denoted by the same reference numerals. Referring to FIG. 5, in the coefficient updating unit 34 of the second embodiment, an attenuation coefficient $μ_{i,j}$ is variably set in accordance with each LUT distortion compensation coefficient $LUT_{i,j}$.

The memory 26 supplies all the j values as an address to the LUT 25. Thereby, each of the j table groups $43_1$ to $43_j$ reads i LUT distortion compensation coefficients. The i LUT distortion compensation coefficients are supplied to the predistortion signal generator 35 and an addition unit 60 within an LUT coefficient updating unit 36. A terminal 52 supplies a feedback signal Fb(t) read from the memory 33 to the predistortion signal generator 35 and the complex conjugate unit 53 within the LUT coefficient updating unit 36.

The predistortion signal generator 35 generates a second predistortion signal PD2(t) by multiplying the feedback signal Fb(t) by LUT distortion compensation coefficients. The predistortion signal generator 35 supplies the second predistortion signal PD2(t) to the subtracter 37. A first predistortion signal PD1(t) is supplied to the subtracter 37 from the memory 28 through the terminal 54. The subtracter 37 obtains an error e(t) by subtracting the second predistortion signal PD2(t) from the first predistortion signal PD1(t). The subtracter 37 supplies the obtained error e(t) to the multipliers $56_1$ to $56_i$ within the LUT coefficient updating unit 36.

On the other hand, the complex conjugate unit 53 obtains the complex conjugate Fb*(t) of the feedback signal Fb(t). This complex conjugate Fb*(t) of the feedback signal Fb(t) is sequentially delayed by a unit period by the (i−1) serially connected unit delay elements $57_1$ to $57_{i-1}$ and supplied to the multipliers $56_1$ to $56_i$. The multipliers $56_1$ to $56_i$ multiply the complex conjugate of the feedback signal by the error e(t) and supply the results to an addition unit 60.

The addition unit 60 includes multiplier groups $61_1$ to $61_i$ each group having j multipliers and adder groups $62_1$ to $62_i$ each group having j adders. The multiplier groups $61_1$ to $61_i$ respectively receive the outputs of the multipliers $56_1$ to $56_i$ and also the corresponding attenuation coefficients $\mu_{i,j}$ through a terminal 63. The multiplier groups $61_1$ to $61_i$ respectively generate values corresponding to the second term $[\mu_{i,j} \times e(t) \times Fb^*(t-i)]$ on the right side of Equation (2) by multiplying the complex conjugate Fb*(t) by the attenuation coefficients $\mu_{i,j}$. The multiplier groups $61_1$ to $61_i$ supply the generated values corresponding to the second term $[\mu_{i,j} \times e(t) \times Fb^*(t-i)]$ on the right side of Equation (2) respectively to the adder groups $62_1$ to $62_i$.

The adder groups $62_1$ to $62_i$ respectively receive values corresponding to the first term $[LUT_{i,j}(|Tx(t-j)|)]$ on the right side of Equation (2) from the LUT 25. The i×j adders of the addition unit 60 respectively calculate i×j LUT distortion compensation coefficients, which correspond to the left side of Equation (2). The i×j LUT distortion compensation coefficients thus computed are supplied to the LUT 25, whereby the LUT 25 is updated.

In the power amplifier apparatus according to the second embodiment, for example, the attenuation coefficient $\mu_{1,1}$ is set to a larger value than other attenuation coefficients $\mu_{i,j}$, where i≠1 and j≠1, among the attenuation coefficients $\mu_{i,j}$, thereby increasing the weight of the LUT distortion compensation coefficient $LUT_{1,1}$ corresponding to a complex baseband signal Tx (t) at time t, which is the main component of a transmission signal. As a result, the power amplifier apparatus according to the second embodiment allows stability and convergence in distortion compensation to be improved compared to techniques described in the background.

[c] Third Embodiment

Figure 6:
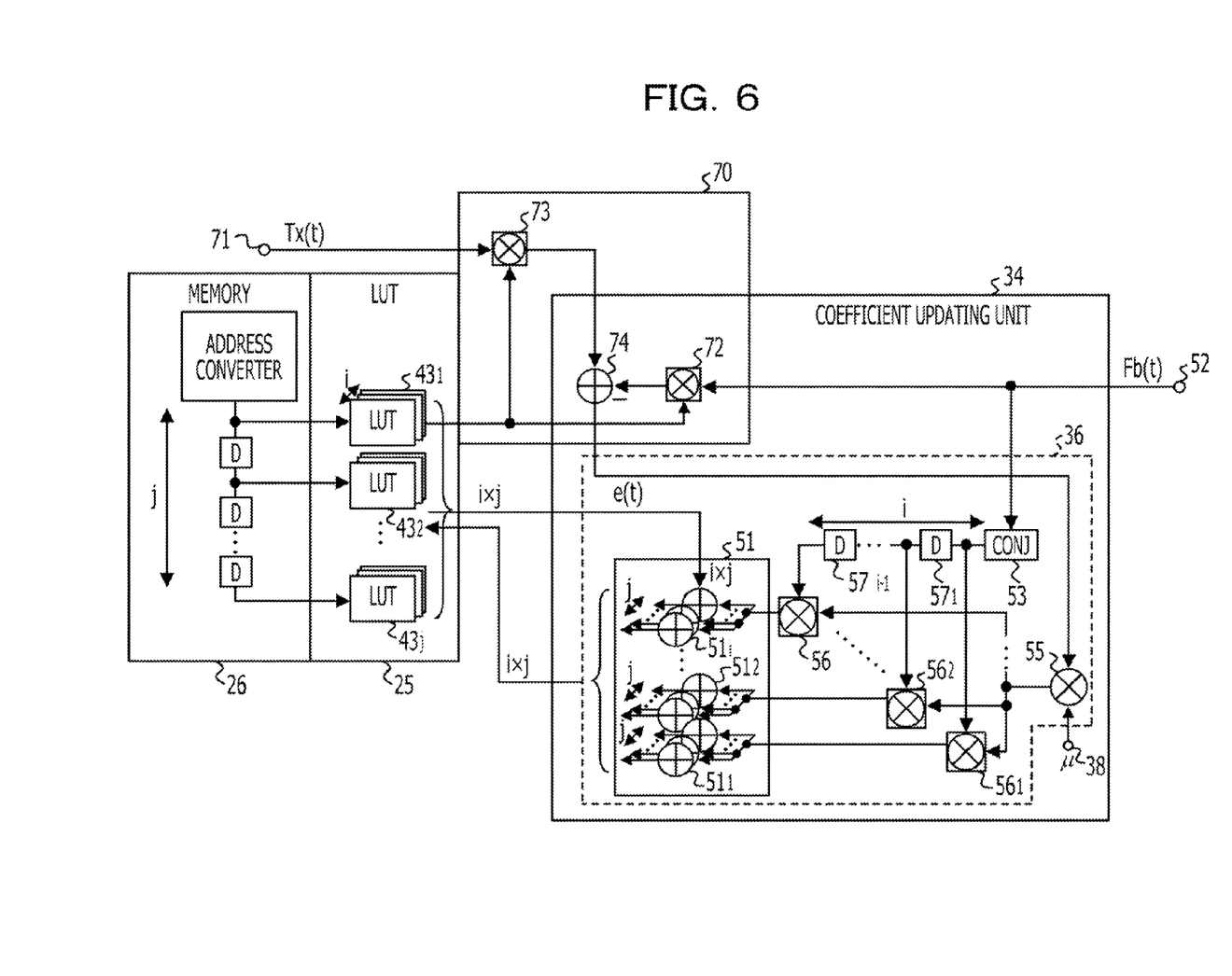
FIG. 6 is a detailed configuration diagram of a coefficient updating unit according to a third embodiment.

FIG. 6 is a detailed configuration diagram of a coefficient updating unit 34 according to a third embodiment. In FIG. 6, portions which are the same as those in FIG. 4 are denoted by the same reference numerals. The coefficient updating unit 34 according to the third embodiment obtains an error e(t) using Equation (4).

$$e(t) = [Tx(t) - Fb(t)] \times LUT_{1,1}(|Tx(t)|) \quad (4)$$

Equation (4) obtains an error e(t) using only complex baseband signals Tx(t) and Fb(t) at time t which are the main components of a transmission signal and a feedback signal. Hence, the configuration of an error generation unit is simplified.

Referring to FIG. 6, the memory 26 supplies all the j values as an address to the LUT 25. Thereby, each of the j table groups $43_1$ to $43_j$ reads i LUT distortion compensation coefficients. The i LUT distortion compensation coefficients are supplied to the addition unit 51 within an LUT coefficient updating unit 36. The single LUT distortion compensation coefficient $LUT_{1,1}$ (|Tx(t)|) read from the table group $43_1$ is supplied to multipliers 72 and 73 within an error generation unit 70. The terminal 52 supplies a feedback signal Fb(t) read from the memory 33 to the error generation unit 70 and the complex conjugate unit (conj) 53 within the LUT coefficient updating unit 36.

The multiplier 72 within the error generation unit 70 multiplies the feedback signal Fb(t) by $LUT_{1,1}(|Tx(t)|)$ and supplies the result to a subtracter 74. The multiplier 73 multiplies the transmission signal Tx(t) supplied through a terminal 71 by $LUT_{1,1}(|Tx(t)|)$. The multiplier 73 supplies the multiplication result to the subtracter 74. The subtracter 74 obtains the error e(t) expressed by Equation (4) by subtracting the output of the multiplier 72 from the output of the multiplier 73. The subtracter 74 supplies the obtained error e(t) to the multiplier 55 within the LUT coefficient updating unit 36. The multiplier 55 receives the attenuation coefficient μ through the terminal 38. The multiplier 55 multiplies the error e(t) by the attenuation coefficient and supplies the result to the multipliers $56_1$ to $56_i$.

On the other hand, the complex conjugate unit 53 obtains the complex conjugate Fb*(t) of the feedback signal Fb(t). This complex conjugate Fb*(t) of the feedback signal Fb(t) is sequentially delayed by a unit period by the (i−1) serially connected unit delay elements $57_1$ to $57_{i-1}$ and supplied to the multipliers $56_1$ to $56_i$. The multipliers $56_1$ to $56_i$ multiply the complex conjugate of the feedback signal by the product of the error e(t) and the attenuation coefficient μ and thereby generate values corresponding to the second term $[\mu \times e(t) \times Fb^*(t-i)]$ on the right side of Equation (2). The multipliers $56_1$ to $56_i$ supply the generated values corresponding to the second term $[\mu \times e(t) \times Fb^*(t-i)]$ on the right side of Equation (2) to the addition unit 51.

The addition unit 51 includes adder groups $51_1$ to $51_i$ each group having j adders. The adder groups $51_1$ to $51_i$ respectively receive the outputs of the multipliers $56_1$ to $56_i$ and also values corresponding to the first term $[LUT_{i,j}(|Tx(t-j)|)]$ on the right side of Equation (2) from the LUT 25. The i×j adders of the addition unit 51 respectively calculate i×j LUT distortion compensation coefficients, which correspond to the left side of Equation (2). The LUT 25 is updated by the i×j LUT distortion compensation coefficients thus calculated.

Note that in the coefficient updating unit 34 according to the third embodiment, the attenuation coefficient $\mu_{i,j}$ may be variably set in accordance with each LUT distortion compensation coefficient $LUT_{i,j}$, similarly to the second embodiment.

[d] Exemplary Configuration of Wireless Base Station Apparatus

Figure 7:
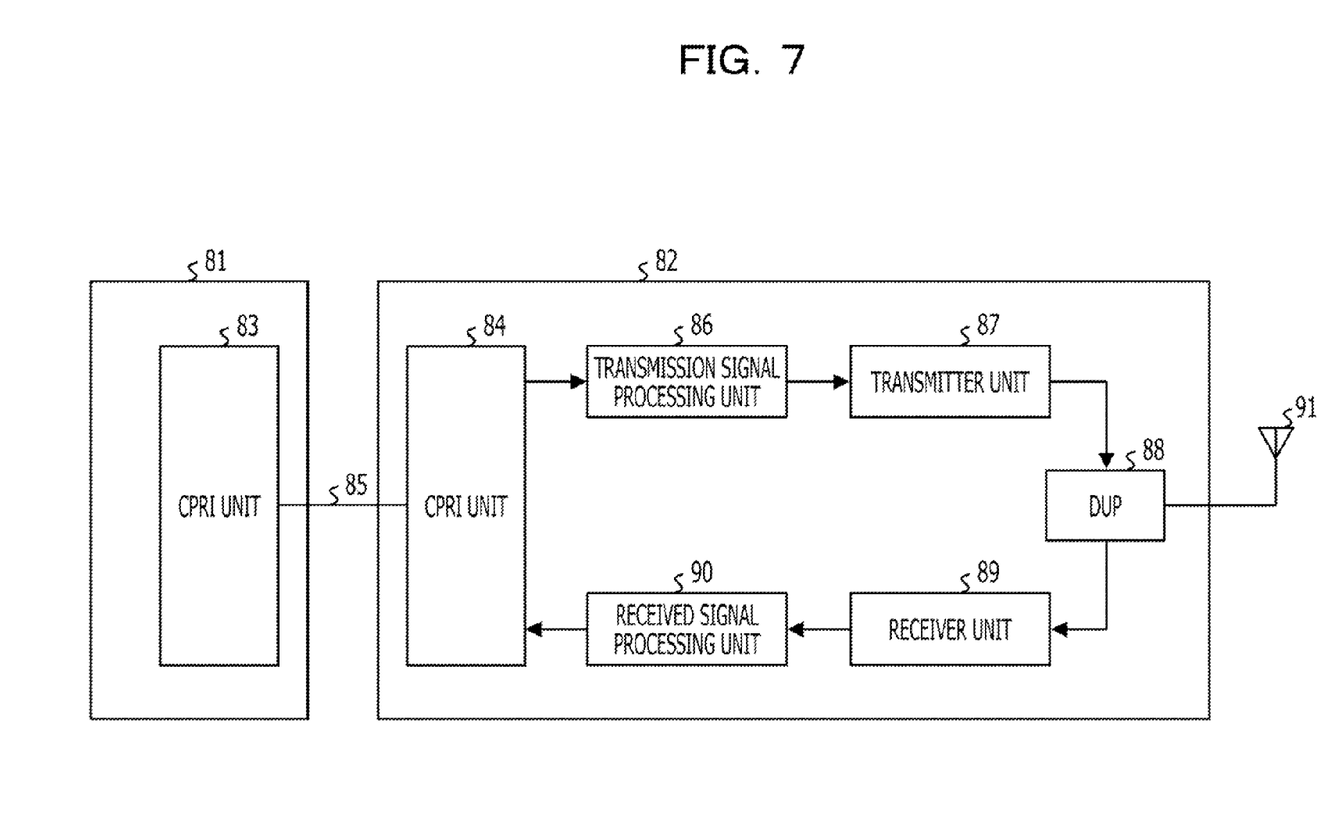
FIG. 7 is a block diagram of an exemplary wireless base station apparatus.

FIG. 7 is a block diagram of an exemplary wireless base station apparatus. Referring to FIG. 7, the wireless base station includes a wireless apparatus control unit 81 and a wireless apparatus 82. A common public radio interface (CPRI) unit 83 of the wireless apparatus control unit 81 and a CPRI unit 84 of the wireless apparatus 82 are connected to each other by a bidirectional CPRI line 85. The wireless apparatus 82 includes, in addition to the CPRI unit 84, a transmission signal processing unit 86, a transmitter unit 87, an antenna sharing unit (DUP) 88, a receiver unit 89, a received signal processing unit 90, and an antenna 91.

The CPRI unit 83 of the wireless apparatus control unit 81 performs CPRI-compliant framing processing on a baseband transmission signal and supplies the signal to the CPRI unit 84. The CPRI unit 84 performs deframing processing on the signal received from the CPRI unit 84. The baseband transmission signal output from the CPRI unit 84 is made to be a complex data transmission signal Tx(t) by the transmission signal processing unit 86 and supplied to the transmitter unit 87. The transmitter unit 87 is the power amplifier apparatus illustrated in FIG. 2. The transmission signal whose power has been amplified by the transmitter unit 87 is supplied through the antenna sharing unit 88 to the antenna 91 and is transmitted in the form of radio waves therefrom.

A signal received by the antenna 91 is supplied through the antenna sharing unit 88 to the receiver unit 89, whereby the signal is received. The received signal processing unit 90 processes the complex data received signal output from the receiver unit 89, and converts the signal into a baseband received signal. The received signal processing unit 90 supplies the baseband received signal to the CPRI unit 84. The CPRI unit 84 performs CPRI-compliant framing processing on the baseband received signal. The CPRI unit 84 supplies the framed signal to the CPRI unit 83. The CPRI unit 83 performs deframing processing on the received signal and supplies the signal to a subsequent circuit.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A power amplifier apparatus comprising:
   a memory configured to store distortion compensation coefficients and addresses, each of the distortion compensation coefficients respectively corresponding to each of the addresses;
   a processor that performs first distortion compensation processing on an input signal using at least one distortion compensation coefficient to obtain a first signal, the at least one distortion compensation coefficient being loaded from the memory in accordance with at least one address respectively, the at least one address being generated from the input signal; and
   an amplifier that amplifies the first signal, wherein
   the processor further performs a second distortion compensation processing on the amplified signal using the at least one distortion compensation coefficient to obtain a second signal and updates the at least one distortion compensation coefficient to enable convergence between the first signal and the second signal, wherein
   the processor calculates a difference between the first signal and the second signal using a main component of the first signal and a main component of the second signal, the difference representing error.

2. The power amplifier according to claim 1, wherein the processor updates the at least one distortion compensation coefficient such that a difference between the first signal and the second signal converges to zero.

3. The power amplifier apparatus according to claim 1, wherein the processor updates the at least one distortion compensation coefficient based on an attenuation coefficient.

4. The power amplifier according to claim 1, wherein the second signal is a feedback signal on which the second distortion compensation processing was performed in accordance with an attenuation coefficient.

5. The power amplifier apparatus according to claim 1, wherein the error is multiplied by a complex conjugate and an attenuation coefficient.

6. A method of distortion compensation processing, the method comprising:
   storing, in a memory, distortion compensation coefficients and addresses, each of the distortion compensation coefficients respectively corresponding to each of the addresses;
   performing a first distortion compensation processing on an input signal using at least one distortion compensation coefficient to obtain a first signal, the at least one distortion compensation coefficient being loaded from the memory in accordance with at least one address respectively, the at least one address being generated from the input signal;
   amplifying the first signal with an amplifier;
   performing a second distortion compensation processing on the amplified signal using the distortion compensation coefficient to obtain a second signal;
   calculating a difference between the first signal and the second signal using a main component of the first signal and a main component of the second signal, the difference representing error; and
   updating, with a processor, the distortion compensation coefficient to a value that enables convergence between the first signal and the second signal.

7. A transmission apparatus that transmits a signal that has been subjected to distortion compensation processing and amplification processing, the apparatus comprising:
   a memory configured to store distortion compensation coefficients and addresses, each of the distortion compensation coefficients respectively corresponding to each of the addresses;
   a processor that performs first distortion compensation processing on an input signal using at least one distortion compensation coefficient, the at least one distortion compensation coefficient being loaded from the memory in accordance with at least one address respectively, the at least one address being generated from the input signal; and
   an amplifier that amplifies the processed signal on which the first distortion compensation processing is performed, wherein
   the processor performs second distortion compensation processing on a feedback portion of the amplified signal using the at least one distortion compensation coefficient and updates the at least one distortion compensation coefficient to a value that enables convergence between the processed signal and the feedback portion of the amplified signal, wherein
   the processor calculates a difference between the processed signal on which the first distortion compensation processing was performed and the feedback portion of the amplified signal using a main component of the processed signal on which the first distortion compensation processing was performed and a main component of the feedback portion of the amplified signal, the difference representing error.

8. A controller comprising:
   a storage device that stores distortion compensation coefficients and addresses each of the distortion compensation coefficients respectively corresponding to each of the addresses;
   a predistorter that performs first distortion compensation processing on an input signal using at least one distortion compensation coefficient to obtain a first signal, the at least one distortion compensation coefficient being loaded from the memory in accordance with at least one address respectively, the at least one address being generated from the input signal; and a coefficient updating unit that performs a second distortion compensation on a feedback signal using the at least one distortion compensation coefficient to obtain a second signal and updates the at least one distortion compensation coefficient, wherein the processor calculates a difference between the first signal and the second signal using a main component of the first signal and a main component of the second signal, the difference representing error.

9. The controller according to claim 8, wherein the at least one distortion compensation coefficient is updated to enable convergence between the first signal and the second signal.

10. The controller according to claim 9, wherein the predistorter provides the at least one compensation coefficient to coefficient updating unit; and the coefficient updating unit updates the at least one distortion compensation coefficient based on the received at least one distortion compensation coefficient and an attenuation value.

11. The power amplifier apparatus according to claim 1, wherein the main component of the first signal is obtained by the first distortion compensation processing using the at least one distortion compensation coefficient that is used without predetermined delay, and the main component of the second signal is obtained by the second distortion compensation processing using the at least one distortion compensation coefficients that is used without predetermined delay.

12. The power amplifier apparatus according to claim 1, wherein the at least one distortion compensation coefficient is obtained without calculating a power series.

* * * * *